(12) United States Patent
Midorikawa

(10) Patent No.: US 12,367,912 B2
(45) Date of Patent: Jul. 22, 2025

(54) SEMICONDUCTOR STORAGE DEVICE INCLUDING SENSE AMPLIFIER THAT SENSES DATA FROM MULTIPLE MEMORY CIRCUITS

(71) Applicants: Kabushiki Kaisha Toshiba, Tokyo (JP); Toshiba Electronic Devices & Storage Corporation, Tokyo (JP)

(72) Inventor: Tsuyoshi Midorikawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 205 days.

(21) Appl. No.: 18/184,329

(22) Filed: Mar. 15, 2023

(65) Prior Publication Data

US 2024/0096380 A1    Mar. 21, 2024

(30) Foreign Application Priority Data

Sep. 21, 2022  (JP) ................. 2022-150566

(51) Int. Cl.
*G11C 7/06* (2006.01)
*G11C 7/10* (2006.01)
*G11C 7/22* (2006.01)
*G11C 7/18* (2006.01)

(52) U.S. Cl.
CPC .............. *G11C 7/06* (2013.01); *G11C 7/1069* (2013.01); *G11C 7/22* (2013.01); *G11C 7/062* (2013.01); *G11C 7/18* (2013.01)

(58) Field of Classification Search
CPC ........... G11C 7/06; G11C 7/1069; G11C 7/22; G11C 11/419
See application file for complete search history.

(56) References Cited

U.S. PATENT DOCUMENTS

| 6,154,396 A | 11/2000 | Yabe et al. |
| 7,058,863 B2 | 6/2006 | Kouchi et al. |
| 8,638,623 B2 * | 1/2014 | Kawasumi ............... G11C 7/08 365/194 |

(Continued)

FOREIGN PATENT DOCUMENTS

| CN | 103873028 A * | 6/2014 | ............... G11C 7/06 |
| JP | 2000-156085 A | 6/2000 | |

(Continued)

*Primary Examiner* — Mushfique Siddique
(74) *Attorney, Agent, or Firm* — Kim & Stewart LLP

(57) ABSTRACT

A semiconductor storage device according to an embodiment comprises: a first memory circuit; a second memory circuit having a storage capacity smaller than that of the first memory circuit; a readout line commonly connected to the first memory circuit and the second memory circuit; a sense amplifier configured to compare a voltage of a first bit signal or a second bit signal with a reference voltage, where the first bit signal being inputted from the first memory circuit through the readout line and the second bit signal being inputted from the second memory circuit through the readout line; and a readout conditioning circuit configured to change at least one of an operation timing of the sense amplifier and the reference voltage corresponding to the first bit signal and the second bit signal.

6 Claims, 16 Drawing Sheets

(56) References Cited

U.S. PATENT DOCUMENTS

| | | | |
|---|---|---|---|
| 2004/0202039 A1* | 10/2004 | Takayanagi | G11C 29/023 365/233.1 |
| 2007/0121394 A1* | 5/2007 | Noda | G11C 7/1066 365/194 |
| 2011/0013468 A1* | 1/2011 | Kawasumi | G11C 7/227 365/194 |
| 2018/0268898 A1* | 9/2018 | Suzuki | G11C 13/0023 |
| 2020/0143880 A1* | 5/2020 | Sforzin | G06F 11/1068 |
| 2023/0326534 A1* | 10/2023 | Hirabayashi | G11C 7/04 |

FOREIGN PATENT DOCUMENTS

| | | | | |
|---|---|---|---|---|
| JP | 2006-268905 A | | 10/2006 | |
| JP | 4212257 B2 | | 1/2009 | |
| JP | 2020021522 A | * | 2/2020 | ......... G11C 11/1673 |
| WO | WO-2020026929 A1 | * | 2/2020 | ......... G11C 11/1673 |

* cited by examiner

SEMICONDUCTOR STORAGE DEVICE INCLUDING SENSE AMPLIFIER THAT SENSES DATA FROM MULTIPLE MEMORY CIRCUITS

CROSS-REFERENCE TO RELATED APPLICATIONS

This application is based upon and claims the benefit of priority from Japanese Patent Application No. 2022-150566, filed on Sep. 21, 2022; the entire contents of which are incorporated herein by reference.

FIELD

Embodiments of the present invention relate to a semiconductor storage device.

BACKGROUND

There is a type of semiconductor storage device that is provided with two types of memory circuits having different storage capacities (sizes) and a sense amplifier. This sense amplifier determines a bit value (0, 1) indicated in an output signal from each of the memory circuits based on the result of comparison between the voltage of the output signal and a reference voltage.

In the semiconductor storage device described above, when output signals from the respective memory circuit are read out with a common line, signal waveforms of the signals may differ among the memory circuits due to a difference in storage capacity. Therefore, when a reference voltage is set based on the memory circuit having a larger storage capacity, for example, there is a risk that the sense amplifier incorrectly reads out the bit values of the memory circuit having a smaller storage capacity.

Meanwhile, when the reference voltage is set based on the memory circuit having a smaller storage capacity, there is a risk that, as the operation of the sense amplifier is delayed, the reading speed of bit values becomes slower.

DETAILED DESCRIPTION

Embodiments will now be explained with reference to the accompanying drawings. The present invention is not limited to the embodiments.

A semiconductor storage device according to an embodiment comprises: a first memory circuit; a second memory circuit having a storage capacity smaller than that of the first memory circuit; a readout line commonly connected to the first memory circuit and the second memory circuit; a sense amplifier configured to compare a voltage of a first bit signal or a second bit signal with a reference voltage, where the first bit signal being inputted from the first memory circuit through the readout line and the second bit signal being inputted from the second memory circuit through the readout line; and a readout conditioning circuit configured to change at least one of an operation timing of the sense amplifier and the reference voltage corresponding to the first bit signal and the second bit signal.

First Embodiment

Figure 1:
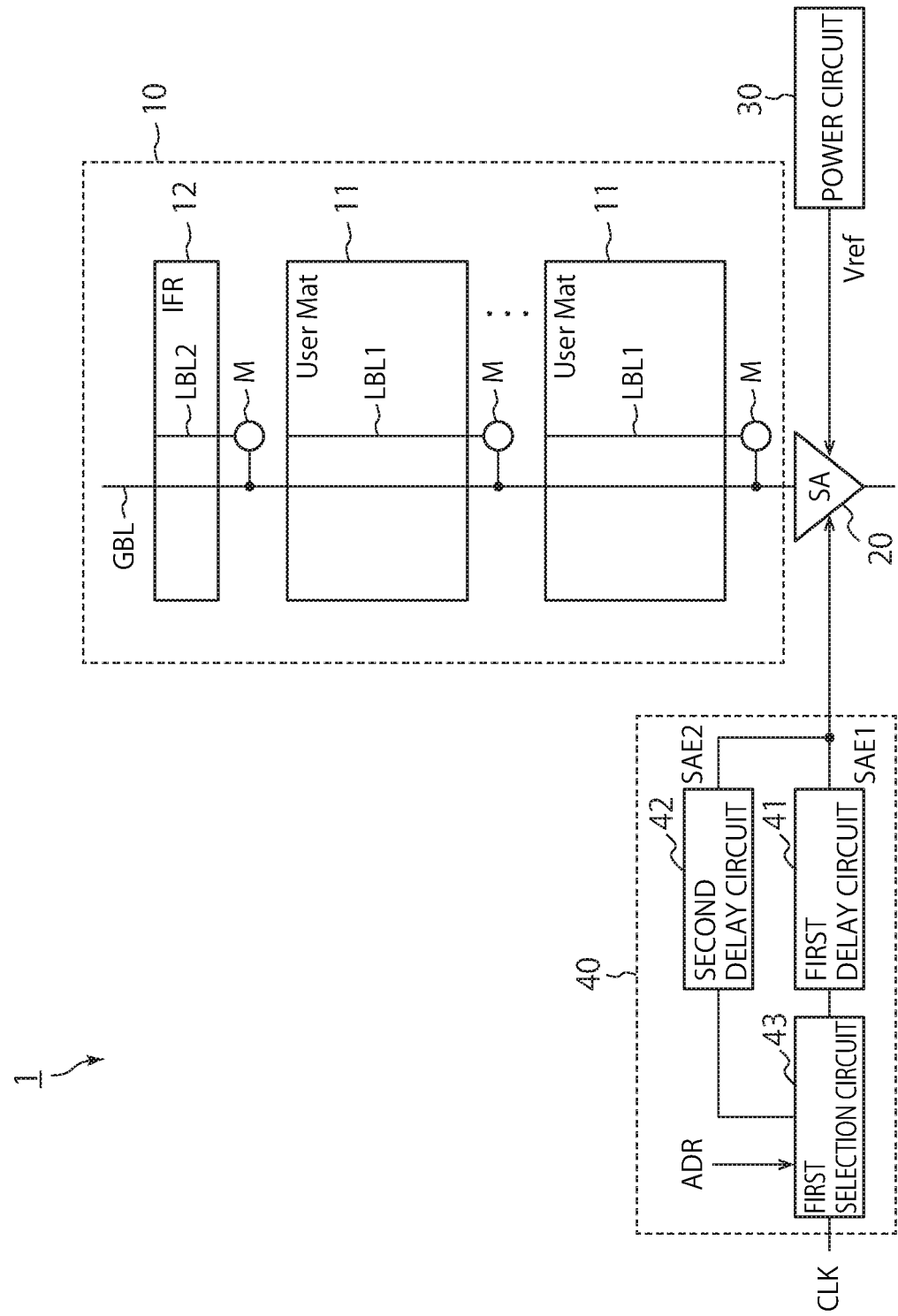
FIG. 1 is a block diagram illustrating a schematic configuration of a semiconductor storage device according to a first embodiment.

FIG. 1 is a block diagram illustrating a schematic configuration of a semiconductor storage device according to a first embodiment. The semiconductor storage device 1 illustrated in FIG. 1 includes a storage part 10, a sense amplifier 20, a power circuit 30, and a first readout conditioning circuit 40.

The storage part 10 includes a plurality of first memory circuits 11, a second memory circuit 12, a plurality of transfer transistors M, and a global bit line GBL. Each of the first memory circuits 11 is a memory cell array that store therein user data and is referred to as "User Material area", for example. The second memory circuit 12 is a memory cell array that stores therein data used when data is read out from the first memory circuit 11 and is referred to as "IFR (InFormation Register) area", for example.

Figure 2:
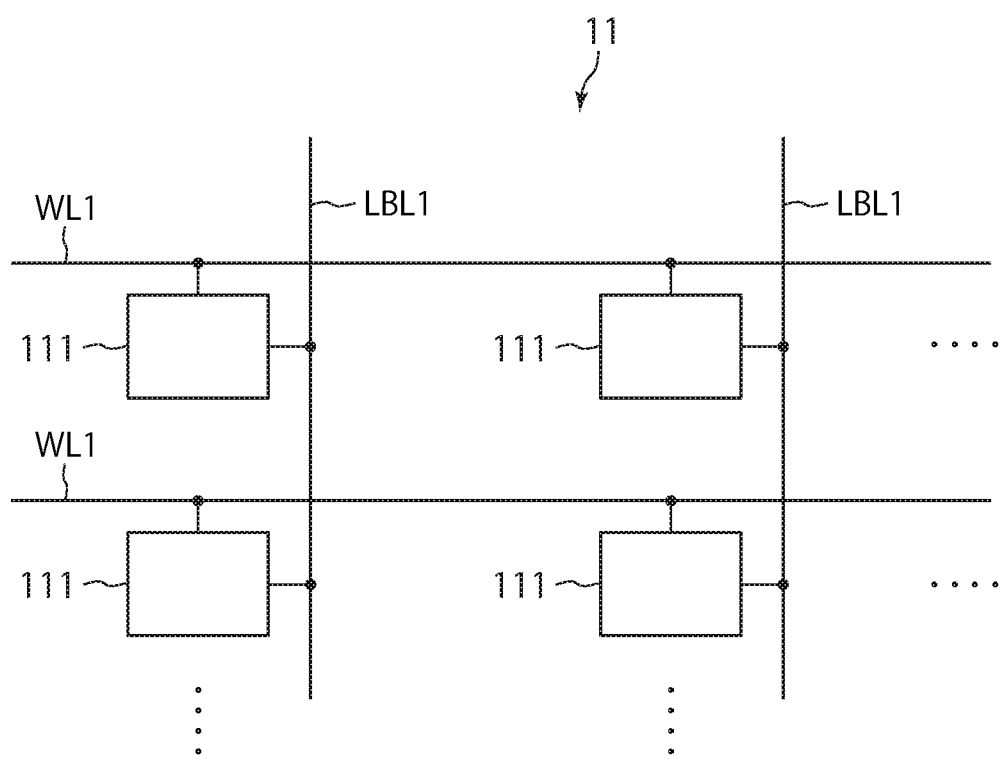
FIG. 2 is a diagram illustrating a schematic circuit configuration of a first memory circuit.

FIG. 2 is a diagram illustrating a schematic circuit configuration of the first memory circuit 11. As illustrated in FIG. 2, a plurality of memory cells 111 are arranged in a matrix in the first memory circuit 11. Each of the memory cells 111 is positioned near an intersection of a word line WL1 for data writing and a local bit line LBL1 for data reading.

For example, a nonvolatile memory element can be applied as the memory cell 111. However, the memory cell 111 is not limited to a nonvolatile memory element and may be another type of memory element such as an SRAM (Static Random Access Memory).

The second memory circuit 12 has a circuit configuration identical to as that of the first memory circuit 11 described above. Note that the storage capacity of the second memory circuit 12 is smaller than that of the first memory circuit 11. That is, the number of memory cells 111 of the second memory circuit 12 is smaller than the number of memory cells 111 of the first memory circuit 11.

The semiconductor storage device 1 according to the present embodiment is provided with a plurality of first memory circuits 11 and one second memory circuit 12. However, each memory cell array can be provided in any number.

Each of the transfer transistors M is provided between the corresponding local bit line LBL1 and the global bit line GBL. When the transfer transistor M is turned on based on control by a control circuit (not illustrated), bit values stored in the memory cells 111 of each of the first memory circuits 11 are outputted to the global bit line GBL. For example, a MOS transistor can be applied as the transfer transistors M.

Further, each of the transfer transistors M is also provided between a local bit line LBL2 of the second memory circuit 12 and the global bit line GBL. When the transfer transistor M is turned on based on control by a control circuit (not illustrated), bit values stored in the memory cells 111 of the second memory circuit 12 are outputted to the global bit line GBL.

The global bit line GBL corresponds to a readout line commonly connected to the first memory circuits 11 and the second memory circuit 12. First bit signals indicating bit values stored in the first memory circuits 11 or second bit signals indicating bit values stored in the second memory circuit 12 are inputted to the sense amplifier 20 via the global bit line GBL.

The global bit line GBL is connected to a first input terminal of the sense amplifier 20. The power circuit 30 is connected a second input terminal of the sense amplifier 20. The sense amplifier 20 compares the voltage of a first or second bit signal with a reference voltage Vref and amplifies the voltage difference. When the voltage of the first or second bit signal is lower than the reference voltage Vref, the sense amplifier 20 outputs a bit value "1". In contrast, when the voltage of the first or second bit signal is higher than the reference voltage Vref, the sense amplifier 20 outputs a bit value "0".

The power circuit 30 generates the reference voltage Vref and outputs the generated reference voltage Vref to the sense amplifier 20. The potential of the reference voltage Vref may be the same as or different from that of a supply voltage VDD. When the potential of the reference voltage Vref is higher than that of the supply voltage VDD, the power circuit 30 is formed of a boost circuit. Meanwhile, when the potential of the reference voltage Vref is lower than that of the supply voltage VDD, the power circuit 30 is formed of a step-down circuit.

The first readout conditioning circuit 40 is a circuit that changes an operation timing of the sense amplifier 20 corresponding to a first or second bit signal, and includes a first delay circuit 41, a second delay circuit 42, and a first selection circuit 43. The operation timing is a timing at which the sense amplifier 20 performs an operation to compare the voltage of the first or second bit signal with the reference voltage Vref.

Figure 3:
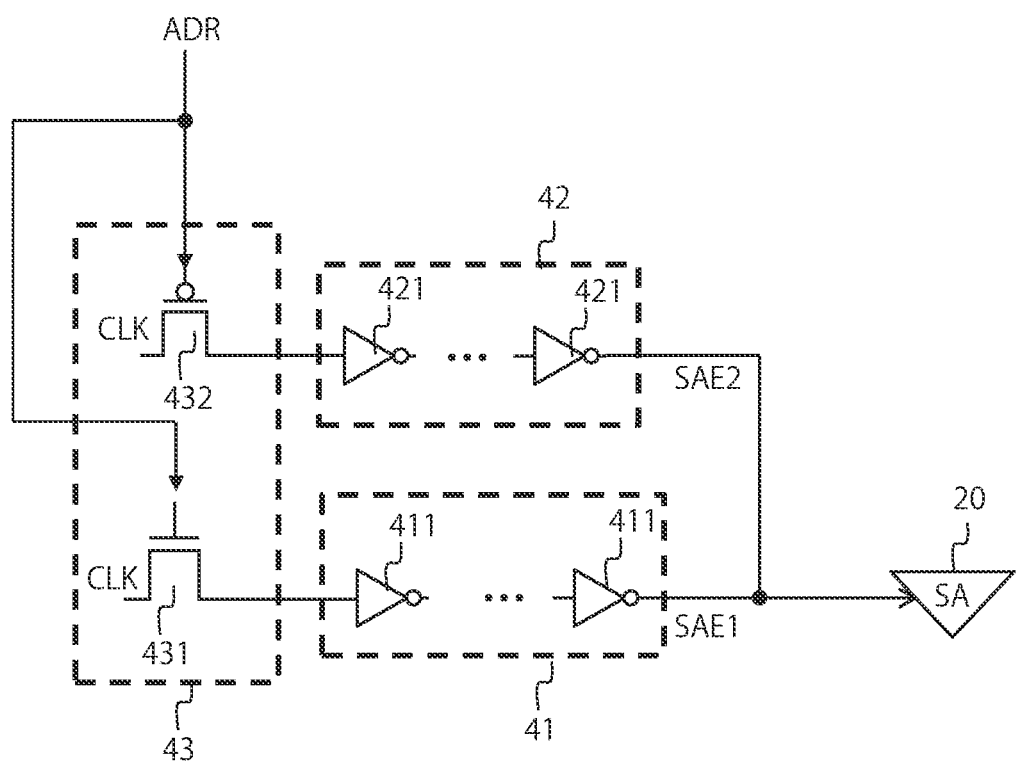
FIG. 3 is a diagram illustrating an example of a circuit configuration of a first readout conditioning circuit.

FIG. 3 is a diagram illustrating an example of a circuit configuration of the first readout conditioning circuit 40. The first delay circuit 41, the second delay circuit 42, and the first selection circuit 43 are described below with reference to FIG. 3.

When a clock signal CLK as a reference signal for the operation timing of the sense amplifier 20 is inputted from an oscillator (not illustrated), the first delay circuit 41 outputs a first delayed signal SAE1 that is delayed by a first time relative to the inputted clock signal CLK to the sense amplifier 20. As illustrated in FIG. 3, the first delay circuit 41 is constituted of, for example, an even number of inverters 411 connected with one another in series.

When the clock signal CLK is inputted from the oscillator, the second delay circuit 42 illustrated in FIG. 3 outputs a second delayed signal SAE2 that is delayed by a second time relative to the inputted clock signal CLK to the sense amplifier 20. The second time is shorter than the first time. As illustrated in FIG. 3, the second delay circuit 42 is constituted of, for example, an even number of inverters 421 connected with one another in series. However, the number of inverters 421 is smaller than the number of inverters 411 of the first delay circuit 41 because the second time is shorter than the first time.

The first selection circuit 43 selects the first delay circuit 41 or the second delay circuit 42 based on an address signal ADR from a control circuit (not illustrated). As illustrated in FIG. 3, the first selection circuit 43 is constituted of, for example, an N-channel MOS transistor 431 connected to the first delay circuit 41 and a P-channel MOS transistor 432 connected to the second delay circuit 42.

The address signal ADR is inputted to the gate of each of the MOS transistors 431 and 432. The level of the address signal ADR indicates that an input signal to the sense amplifier 20 is a first bit signal from the first memory circuit 11 or a second bit signal from the second memory circuit 12.

When the address signal ADR is at a high level, it indicates that the input signal to the sense amplifier 20 is a first bit signal. In this case, the MOS transistor 431 is turned on and the MOS transistor 432 is turned off. With this operation, the clock signal CLK is inputted to the first delay circuit 41 via the MOS transistor 431, so that a first delayed signal SAE1 is inputted to the sense amplifier 20.

Meanwhile, when the address signal ADR is at a low level, it indicates that the input signal to the sense amplifier 20 is a second bit signal. In this case, the MOS transistor 431 is turned off and the MOS transistor 432 is turned on. With this operation, the clock signal CLK is inputted to the second delay circuit 42 via the MOS transistor 432, so that a second delayed signal SAE2 is inputted to the sense amplifier 20.

In the present embodiment, the first selection circuit 43 is positioned at a front stage of the first delay circuit 41 and the second delay circuit 42. However, the first selection circuit 43 may be positioned at a rear stage of the first delay circuit 41 and the second delay circuit 42. Also in this case, the first selection circuit 43 can select the first delay circuit 41 or the second delay circuit 42 in accordance with an input signal to the sense amplifier 20.

A semiconductor storage device according to a comparative example is described here in comparison with the semiconductor storage device 1 according to the first embodiment described above.

Figure 4:
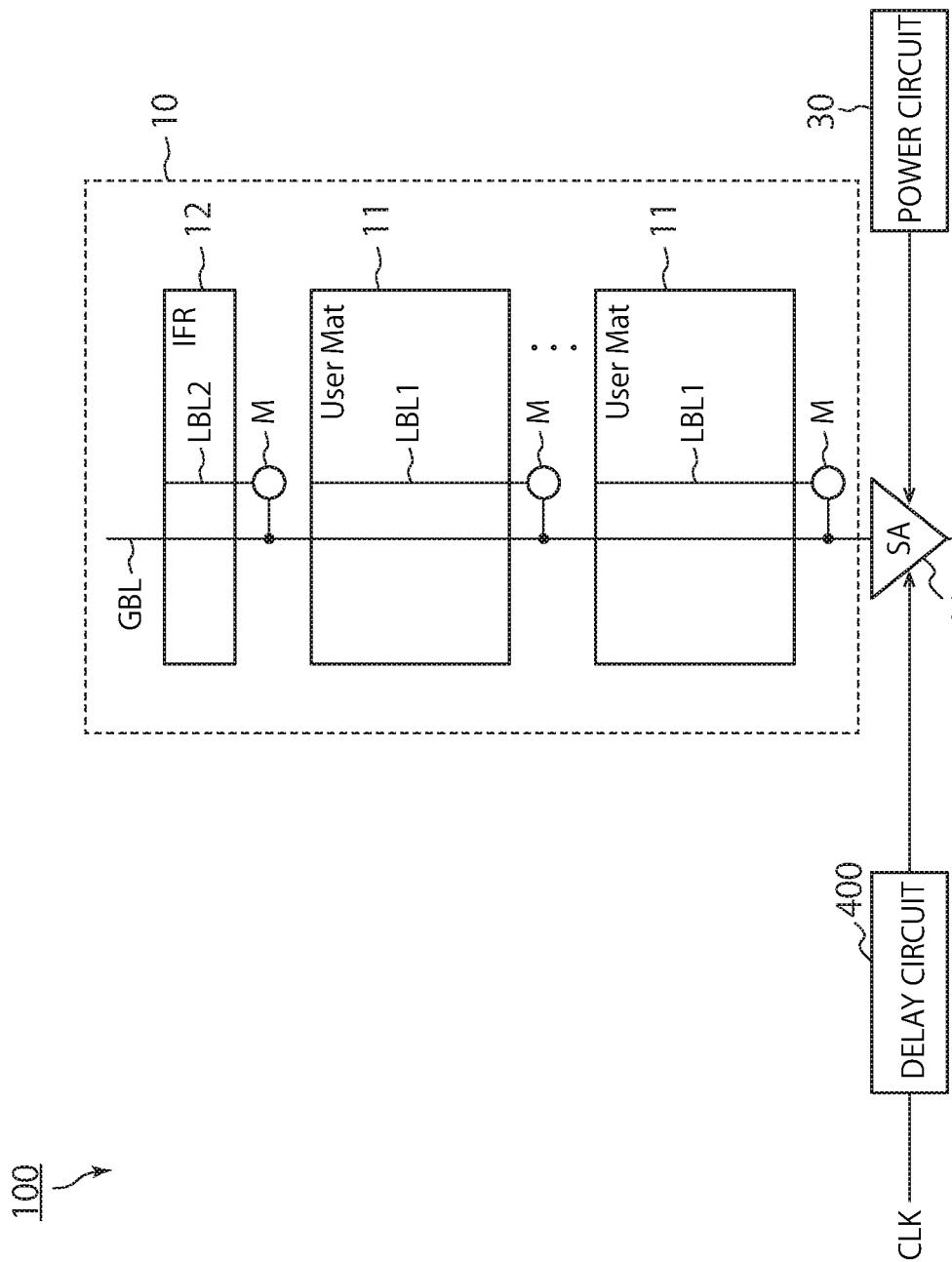
FIG. 4 is a block diagram illustrating a schematic configuration of a semiconductor storage device according to a comparative example.

FIG. 4 is a block diagram illustrating a schematic configuration of a semiconductor storage device according to a comparative example. In this comparative example, constituent elements identical to those of the semiconductor storage device 1 according to the first embodiment are denoted with like reference signs and detailed explanations thereof are omitted.

A semiconductor storage device 100 according to the comparative example is provided with a delay circuit 400 in place of the first readout conditioning circuit 40. The delay circuit 400 outputs a delayed signal SAE whose delay time relative to the clock signal CLK is constant to the sense amplifier 20, regardless of whether input signals to the sense amplifier 20 are first bit signals from the first memory circuits 11 or second bit signals from the second memory circuit 12.

Figure 5:
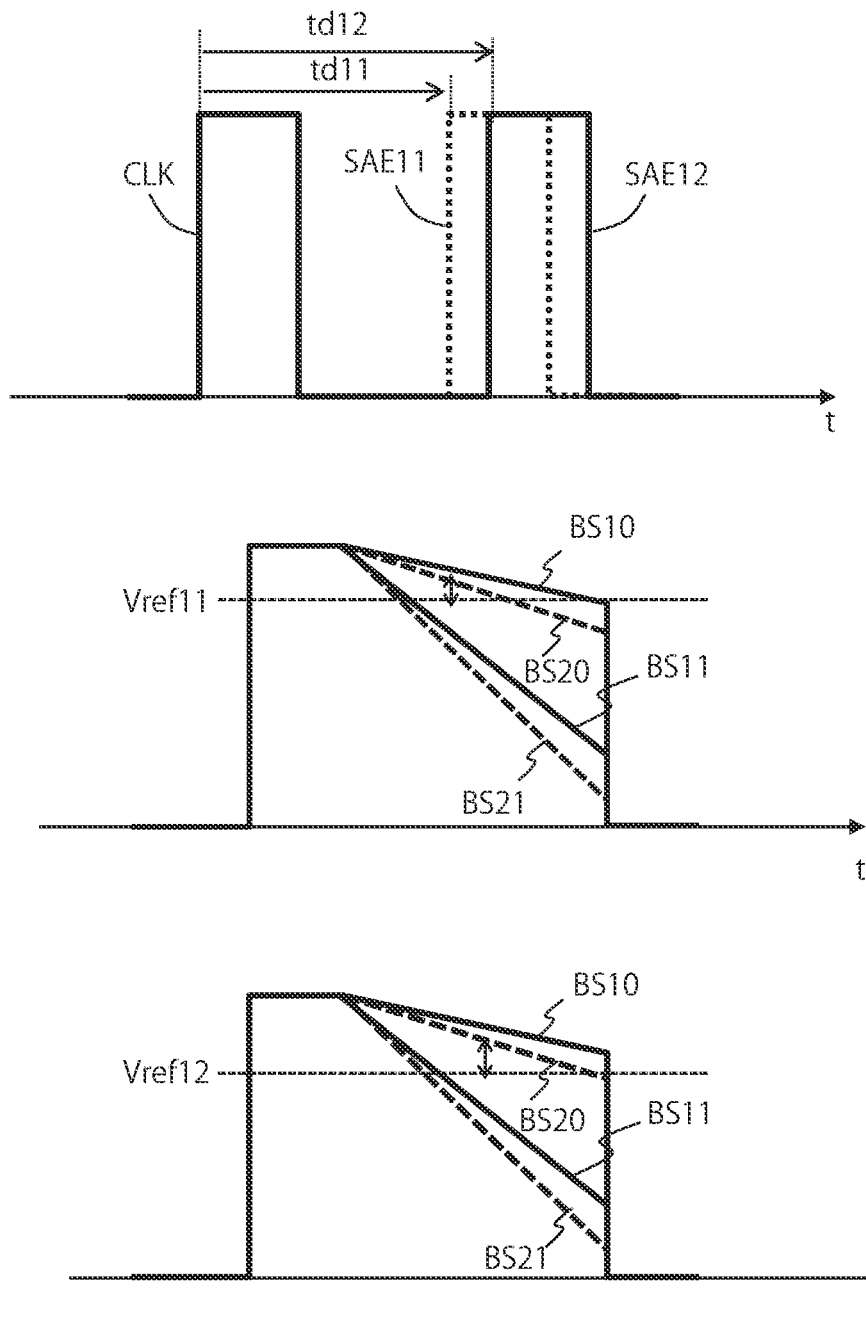
FIG. 5 is a timing chart of a readout operation of the semiconductor storage device according to the comparative example.

FIG. 5 is a timing chart of a readout operation of the semiconductor storage device 100 according to the comparative example. It is assumed that the sense amplifier 20 of the semiconductor storage device 100 illustrated in FIG. 4 compares the voltage of an input signal with a reference voltage Vref11 based on a delayed signal SAE11 that is delayed by a time td11 relative to the clock signal CLK. At this time, when the input signals to the sense amplifier 20 are first bit signals BS10 each indicating a bit value "0" and first bit signals BS11 each indicating a bit value "1" from the first memory circuits 11, a sufficient voltage difference between the voltage of each of the first bit signals and the reference voltage Vref11 can be ensured. Therefore, readout failure of bit values is unlikely to occur.

However, when the input signals to the sense amplifier 20 are second bit signals BS20 each indicating a bit value "0" and second bit signals BS21 each indicating a bit value "1" from the second memory circuit 12, the voltage difference between the voltage of each of the second bit signals BS20 and the reference voltage Vref11 is insufficient. Therefore, there is an increased possibility that the sense amplifier 20 incorrectly reads a bit value "0" as a bit value "1".

Accordingly, in the semiconductor storage device 100 according to the comparative example, the output voltage of the power circuit 30 is set to a reference voltage Vref12 that is lower than the reference voltage Vref11. Furthermore, the delay circuit 400 outputs a delayed signal SAE12 that is delayed by a time td12 longer than the time td11 to the sense amplifier 20. In this case, since a sufficient voltage difference is ensured between the voltage of each second bit signal BS20 and the reference voltage Vref12, readout failure of bit values can be reduced. However, since the delay time relative to the clock signal CLK is extended, the readout speed of bit values is decreased.

Figure 6:
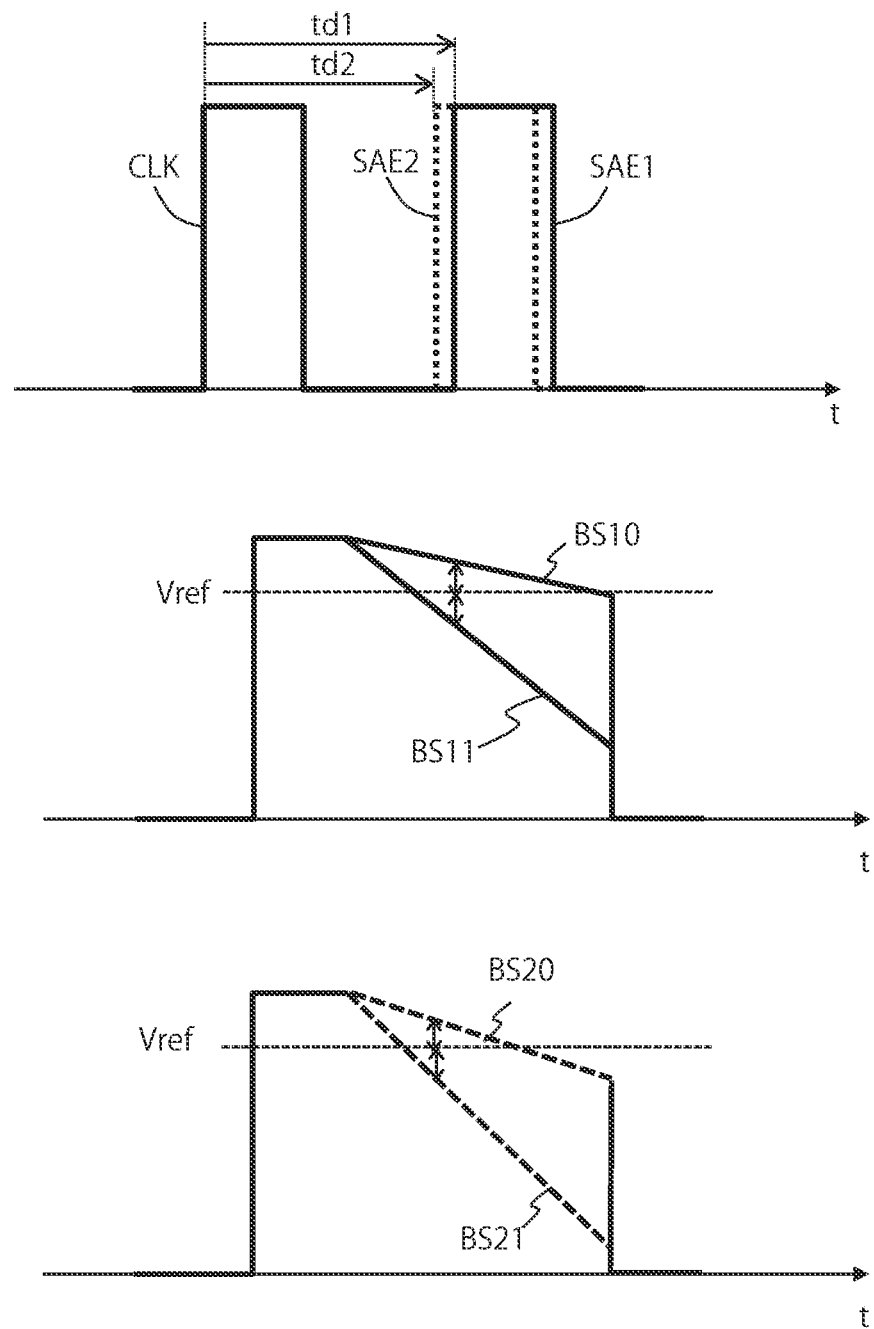
FIG. 6 is a timing chart of a readout operation of the semiconductor storage device according to the first embodiment.

FIG. 6 is a timing chart of a readout operation of the semiconductor storage device 1 according to the first embodiment. In the present embodiment, as described above, when the input signals to the sense amplifier 20 are first bit signals BS10 and BS11 from the first memory circuits 11, the sense amplifier 20 compares the voltage of each of the first bit signals BS10 and BS11 with the reference voltage Vref at a timing delayed by a first time td1 relative to the clock signal CLK. At this time, since the first time td1 is equivalent to the time td11 of the comparative example, a sufficient voltage difference is ensured between the voltage of each of the first bit signals BS10 and BS11 and the reference voltage Vref. Therefore, readout failure of bit values is unlikely to occur. Further, at the time of reading out the first bit signals BS10 and BS11, since the delay time relative to the clock signal CLK is shorter than that of the comparative example, the readout speed of the bit values of the first bit signals BS10 and BS11 can be improved.

Meanwhile, when the input signals to the sense amplifier 20 are second bit signals BS20 and BS21 from the second memory circuit 12, the sense amplifier 20 compares the voltage of each of the second bit signals BS20 and BS21 with the reference voltage Vref at a timing delayed by a second time td2 relative to the clock signal CLK. At this time, the second time td2 is shorter than the first time td1. Therefore, particularly, the voltage difference between the voltage of each of the second bit signals BS20 and the reference voltage Vref becomes larger than the voltage difference at the first time td1. Since this allows a large voltage difference to be sufficiently ensured, readout failure of bit values can be reduced.

Further, when the second bit signals BS20 and BS21 are read out, since the delay time relative to the clock signal CLK is shorter than that of the comparative example, the readout speed of the second bit signals BS20 and BS21 can be improved. In the present embodiment, the voltage difference between the voltage of each of the second bit signals BS21 and the reference voltage Vref tends to be smaller than that at the first time td1; however, the voltage difference is sufficiently ensured so as to avoid readout failure of bit values even when it is at the second time td2.

Second Embodiment

Figure 7:
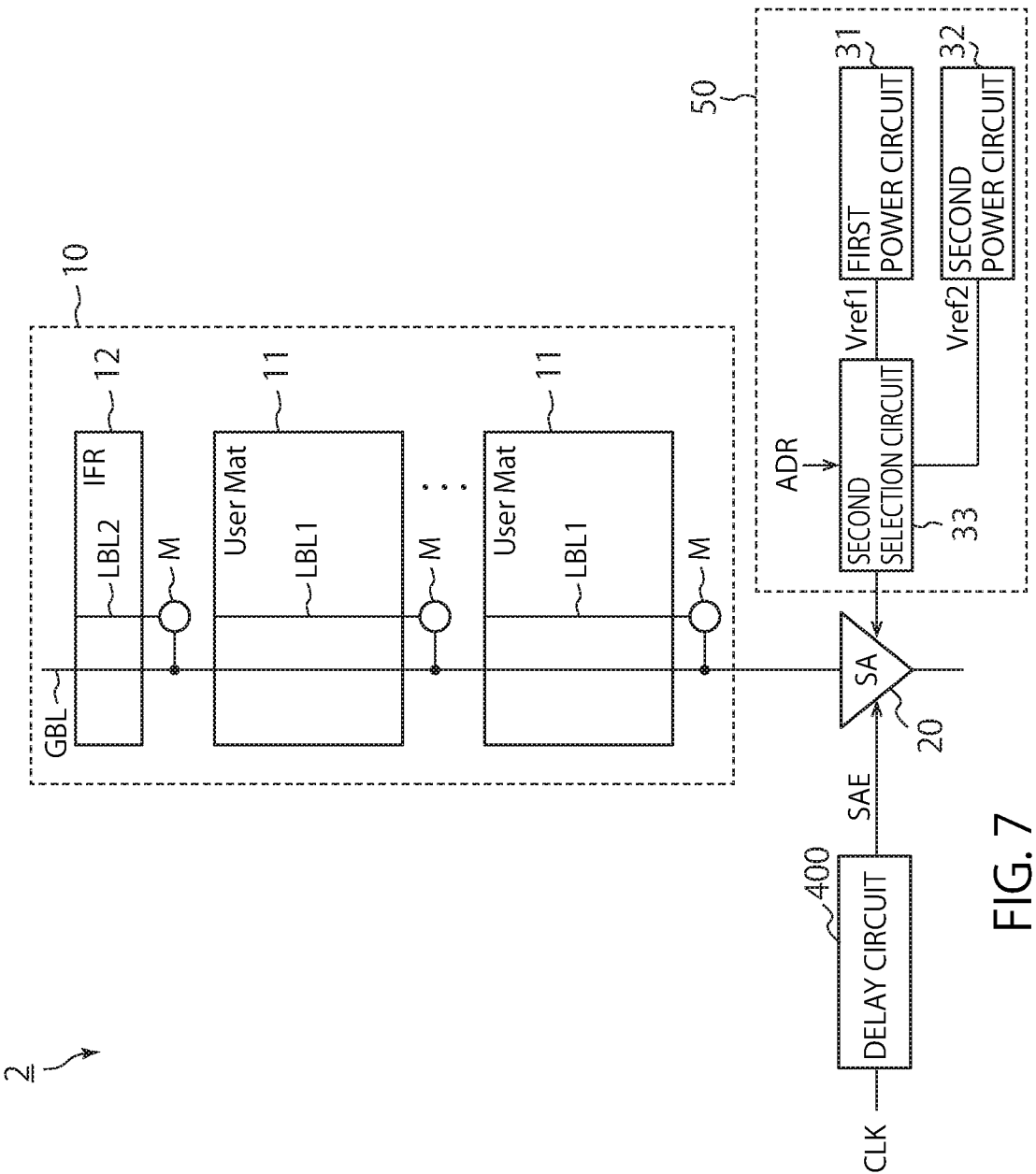
FIG. 7 is a block diagram illustrating a schematic configuration of a semiconductor storage device according to a second embodiment.

FIG. 7 is a block diagram illustrating a schematic configuration of a semiconductor storage device according to a second embodiment. In the present embodiment, constituent elements identical to those of the semiconductor storage device 1 according to the first embodiment are denoted with like reference signs and detailed explanations thereof are omitted.

A semiconductor storage device 2 according to the present embodiment is different from the semiconductor storage device 1 according to the first embodiment in that the semiconductor storage device 2 includes a delay circuit 400 and a second readout conditioning circuit 50. The delay circuit 400 outputs the delayed signal SAE whose delay time relative to the clock signal CLK is constant to the sense amplifier 20, regardless of whether input signals to the sense amplifier 20 are first bit signals BS10 and BS11 or second bit signals BS20 and BS21.

The second readout conditioning circuit 50 includes a first power circuit 31, a second power circuit 32, and a second selection circuit 33. Each of the circuits is described below.

The first power circuit 31 generates a first reference voltage Vref1 and outputs the generated voltage to the sense amplifier 20. The potential of the first reference voltage Vref1 is set to, for example, 91% (VDD×0.91) of a supply voltage VDD. Therefore, the first power circuit 31 is constituted of a step-down circuit that steps down the supply voltage VDD.

The second power circuit 32 generates a second reference voltage Vref2 and outputs the generated voltage to the sense amplifier 20. The potential of the second reference voltage Vref2 is set to, for example, 90% (VDD×0.90) of the supply voltage VDD. That is, the second reference voltage Vref2 is lower than the first reference voltage Vref1. The second power circuit 32 is also constituted of a step-down circuit that steps down the supply voltage VDD.

The second selection circuit 33 selects the first power circuit 31 or the second power circuit 32 based on the address signal ADR from a control circuit (not illustrated). Similarly to the first selection circuit 43 (see FIG. 3), the second selection circuit 33 is constituted of an N-channel MOS transistor 431 and a P-channel MOS transistor 432. In the present embodiment, the first power circuit 31 is connected to the MOS transistor 431. Meanwhile, the second power circuit 32 is connected to the MOS transistor 432.

In the second readout conditioning circuit 50, when the address signal ADR at a high level is inputted to the second selection circuit 33, the MOS transistor 431 is turned on and the MOS transistor 432 is turned off. This causes the first reference voltage Vref1 to be inputted to the sense amplifier 20.

In contrast, when the address signal ADR at a low level is inputted to the second selection circuit 33, the MOS transistor 431 is turned off and the MOS transistor 432 is turned on. This causes the second reference voltage Vref2 to be inputted to the sense amplifier 20.

Figure 8:
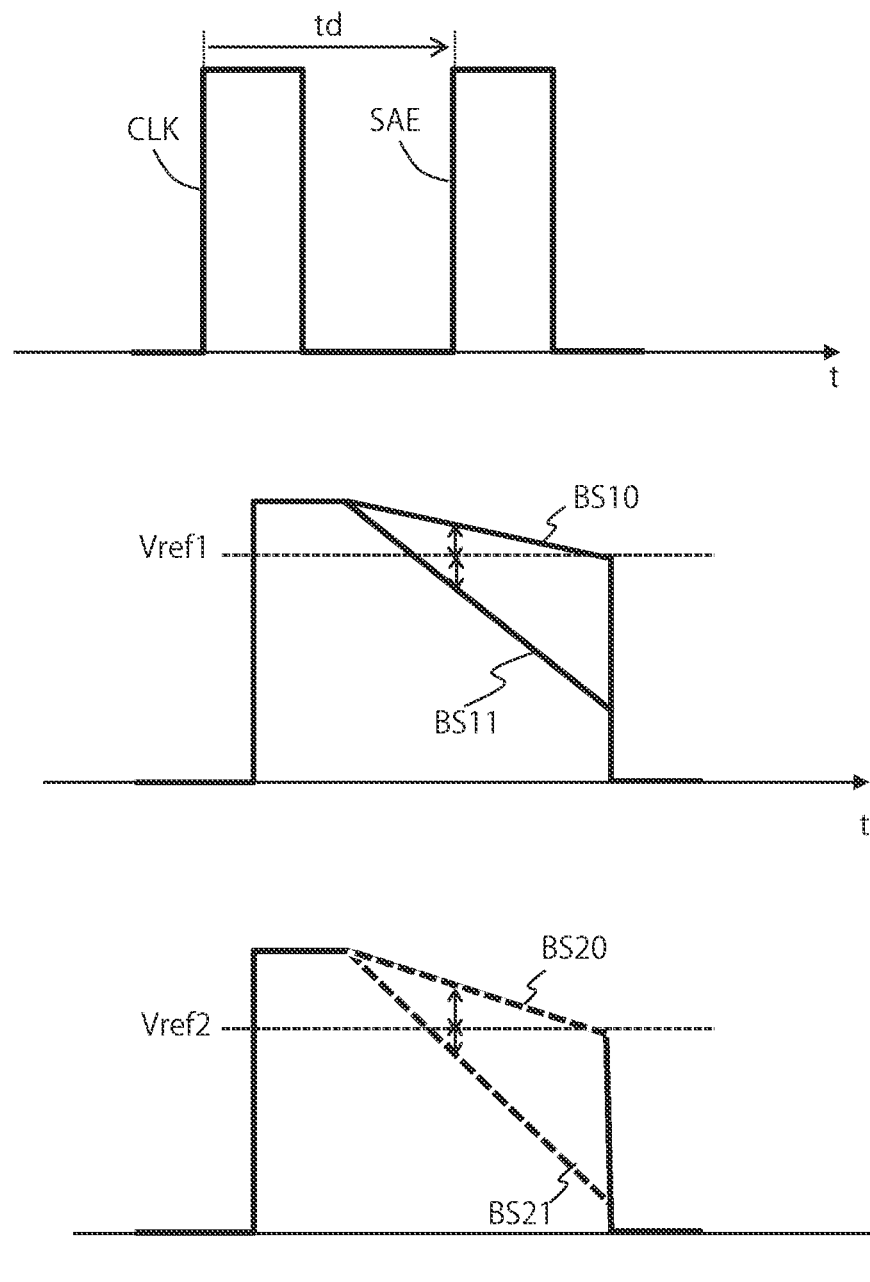
FIG. 8 is a timing chart of a readout operation of the semiconductor storage device according to the second embodiment.

FIG. 8 is a timing chart of a readout operation of the semiconductor storage device 2 according to the second embodiment. In the present embodiment, when input signals to the sense amplifier 20 are first bit signals BS10 and BS11 from the first memory circuits 11, the sense amplifier 20 compares the voltage of each of the first bit signals BS10 and BS11 with the first reference voltage Vref1 at a timing delayed by a time td relative to the clock signal CLK. At this time, since the time td is equivalent to the first time td1 of the first embodiment, a sufficient voltage difference is ensured between the voltage of each of the first bit signals BS10 and BS11 and the reference voltage Vref1. Therefore, readout failure of bit values is reduced. Further, at the time of reading out the first bit signals BS10 and BS11, since the delay time relative to the clock signal CLK is shorter than that of the comparative example, the readout speed of the first bit signals BS10 and BS11 can be improved.

Meanwhile, when the input signals to the sense amplifier 20 are second bit signals BS20 and BS21 from the second memory circuit 12, the sense amplifier 20 compares the voltage of each of the second bit signals BS20 and BS21 with the second reference voltage Vref2 at a timing delayed by the time td relative to the clock signal CLK. At this time, the second reference voltage Vref2 is lower than the first reference voltage Vref1. Therefore, particularly, the voltage difference between the voltage of each of the second bit signals BS20 and the second reference voltage Vref2 becomes larger than the voltage difference with the first reference voltage Vref1. Since this allows a large voltage difference to be sufficiently ensured, readout failure of bit values can be reduced.

Further, at the time of reading out the second bit signals BS20 and BS21, since the delay time relative to the clock signal CLK is shorter than that of the comparative example, the readout speed of the second bit signals BS20 and BS21 can be improved. Also in the present embodiment, the voltage difference between the voltage of each of the second bit signals BS21 and the second reference voltage Vref2 tends to be smaller than that at the first reference voltage Vref1; however, the voltage difference is sufficiently ensured so as to avoid readout failure of bit values even with the second reference voltage Vref2.

Third Embodiment

Figure 9:
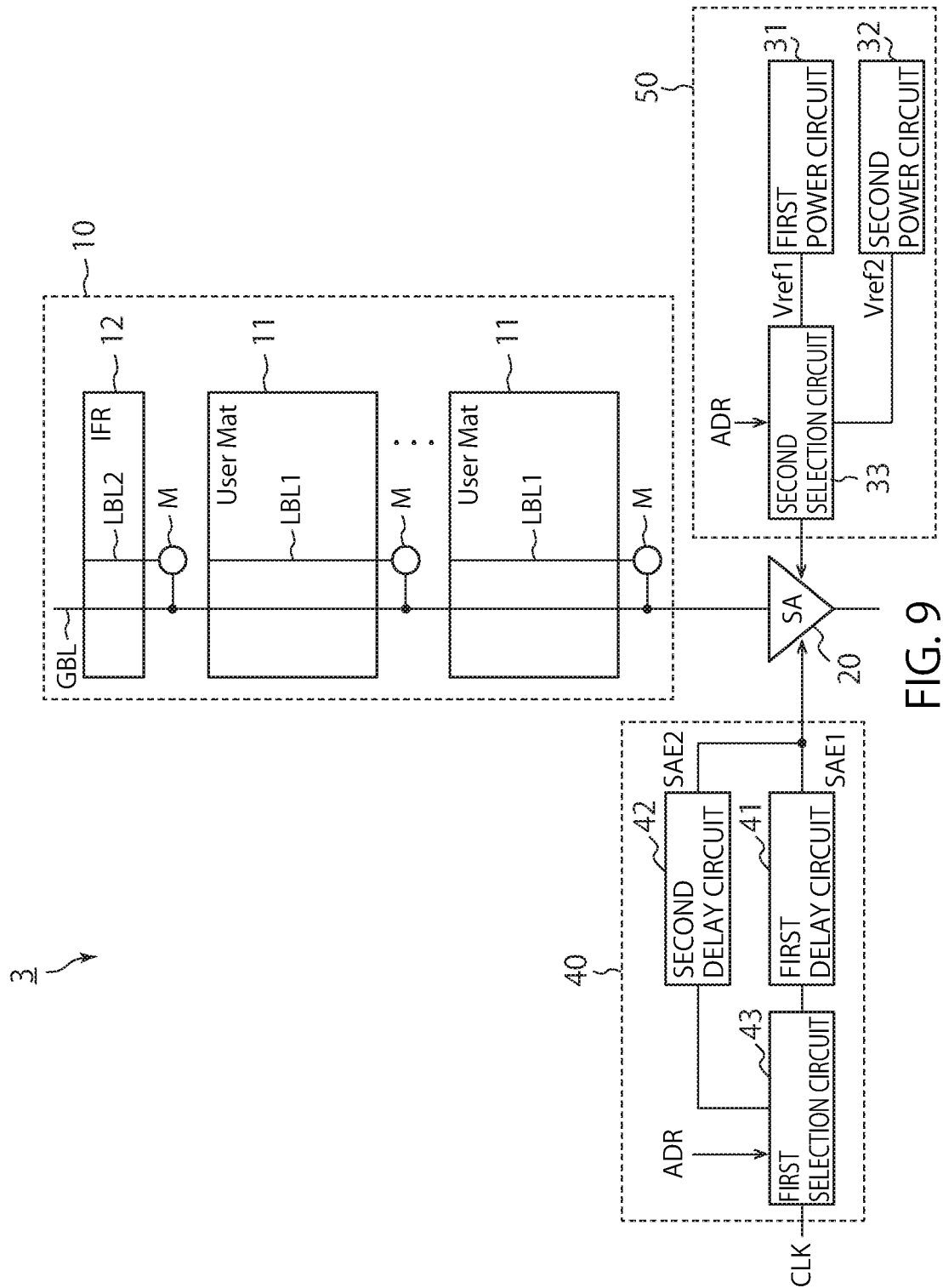
FIG. 9 is a block diagram illustrating a schematic configuration of a semiconductor storage device according to a third embodiment.

FIG. 9 is a block diagram illustrating a schematic configuration of a semiconductor storage device according to a third embodiment. A semiconductor storage device 3 according to the present embodiment includes both the first readout conditioning circuit 40 described in the first embodiment and the second readout conditioning circuit 50 described in the second embodiment. Since each of the readout conditioning circuits has been described in the first and second embodiments, further descriptions thereof are omitted.

Figure 10:
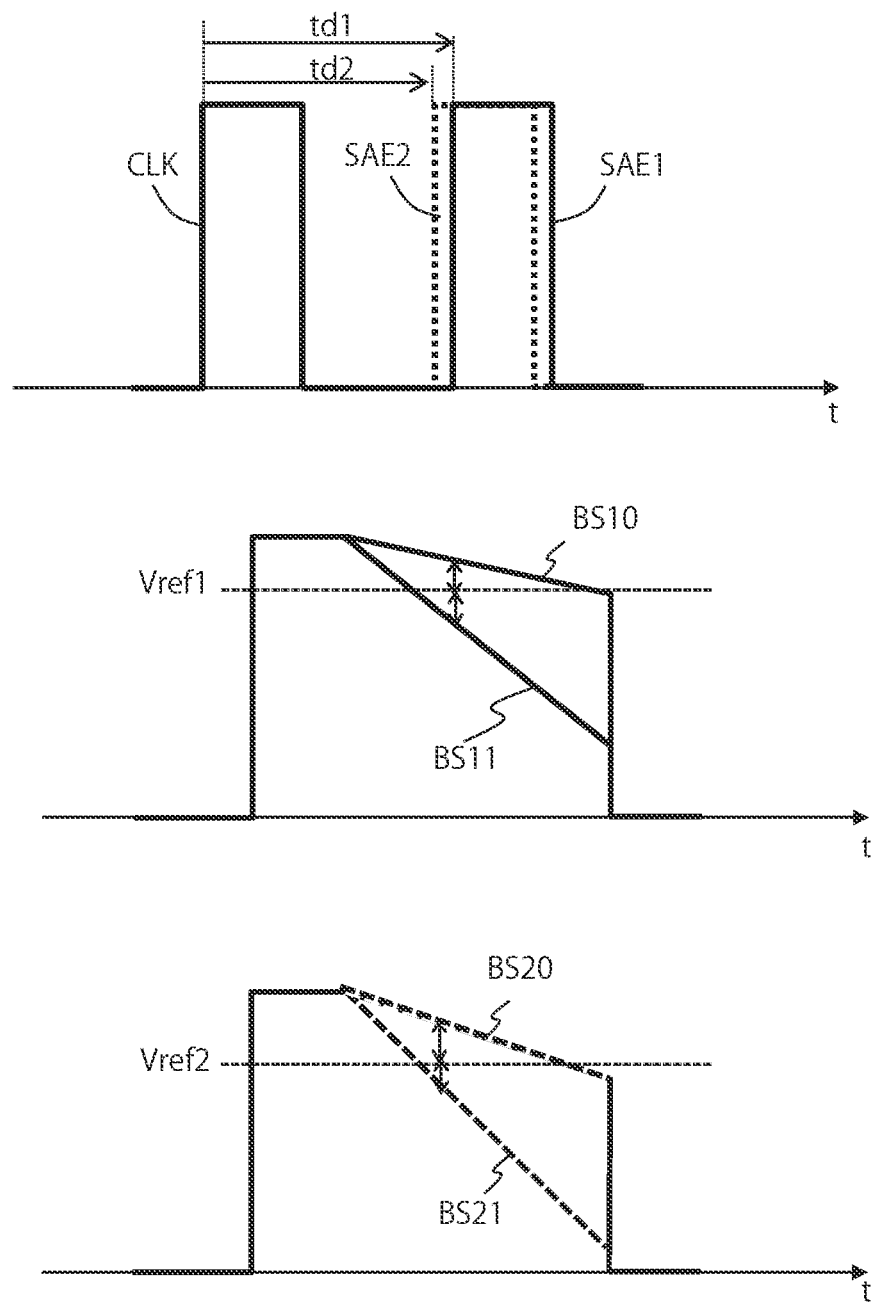
FIG. 10 is a timing chart of a readout operation of the semiconductor storage device according to the third embodiment.

FIG. 10 is a timing chart of a readout operation of the semiconductor storage device 3 according to the third embodiment. In the present embodiment, when input signals to the sense amplifier 20 are first bit signals BS10 and BS11 from the first memory circuits 11, the sense amplifier 20 compares the voltage of each of the first bit signals BS10 and BS11 with the first reference voltage Vref1 at a timing delayed by the first time td1 relative to the clock signal CLK. At this time, a sufficient voltage difference is ensured between the voltage of each of the first bit signals BS10 and BS11 and the first reference voltage Vref1. Therefore, readout failure of bit values can be reduced. Further, the readout speed of first bit signals BS10 and BS11 can be improved as compared to the comparative example.

Meanwhile, when the input signals to the sense amplifier 20 are second bit signals BS20 and BS21 from the second memory circuit 12, the sense amplifier 20 compares the voltage of each of the second bit signals BS20 and BS21 with the second reference voltage Vref2 at a timing delayed by the second time td2 relative to the clock signal CLK. At this time, the second reference voltage Vref2 is lower than the first reference voltage Vref1. Therefore, particularly, a sufficient voltage difference can be ensured between the voltage of the second bit signal BS20 and the second reference voltage Vref2, and thus readout failure of bit values can be reduced.

Further, since the delay time relative to the clock signal CLK at the time of reading out the second bit signals BS20 and BS21 is shorter than that at the time of reading out the first bit signals BS10 and BS11, the readout speed of the second bit signals BS20 and BS21 can be improved. Also in the present embodiment, the voltage difference between the voltage of the second bit signal BS21 and the second reference voltage Vref2 tends to be smaller than that at the first reference voltage Vref1; however, the voltage difference is sufficiently ensured so as to avoid readout failure of bit values even with the second reference voltage Vref2.

(First Modification)

Figure 11:
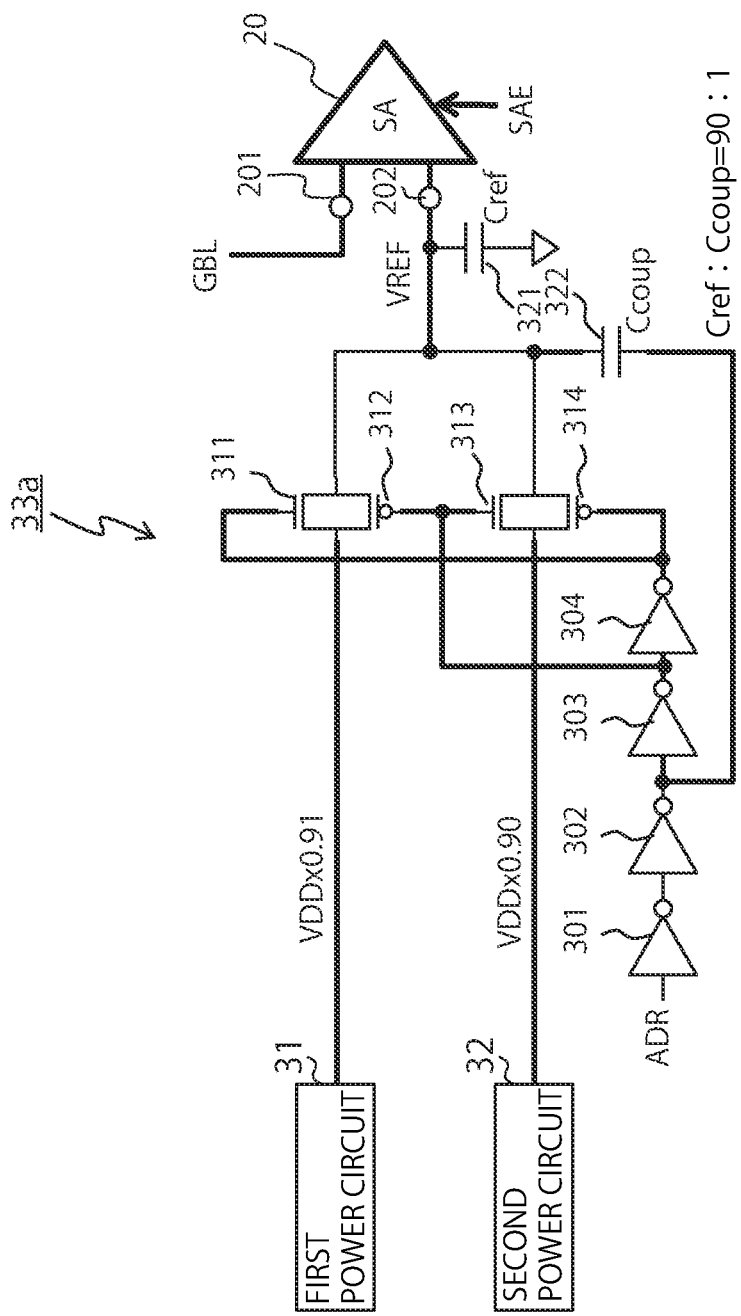
FIG. 11 is a block diagram illustrating a configuration of a second selection circuit according to a first modification.

FIG. 11 is a block diagram illustrating a configuration of a second selection circuit according to a first modification. A second selection circuit 33*a* illustrated in FIG. 11 includes inverters 301 to 304, first to fourth switching elements 311 to 314, a first capacitive element 321, and a second capacitive element 322.

The inverters 301 to 304 are connected with one another in series in this order. The address signal ADR is inputted to an input terminal of the inverter 301 at a frontmost stage.

The first switching element 311 and the third switching element 313 are N-channel MOS transistors, for example. The second switching element 312 and the fourth switching element 314 are P-channel MOS transistors, for example.

The first switching element 311 and the second switching element 312 are a pair of switching elements connected to each other in parallel between the first power circuit 31 and a second input terminal 202 of the sense amplifier 20. The gate of the first switching element 311 is connected to an output terminal of the inverter 304 at a rearmost stage. The gate of the second switching element 312 is connected to an output terminal of an inverter 303 at a middle stage.

The third switching element 313 and the fourth switching element 314 are a pair of switching elements connected to each other in parallel between the second power circuit 32 and the second input terminal 202 of the sense amplifier 20. The gate of the third switching element 313 and the gate of the second switching element 312 are commonly connected to an output terminal of the inverter 303. The gate of the fourth switching element 314 and the gate of the first switching element 311 are commonly connected to an output terminal of the inverter 304.

One end of the first capacitive element 321 is grounded. The other end of the first capacitive element 321 is connected to the second input terminal 202 of the sense amplifier 20.

One end of the second capacitive element 322 is connected to an output terminal of the inverter 302. The other end of the second capacitive element 322 is connected to the second input terminal 202 of the sense amplifier 20.

A capacitance value Ccoup of the second capacitive element 322 is smaller than a capacitance value Cref of the first capacitive element 321. The capacitance ratio of the capacitance value Ccoup to the capacitance value Cref is set based on a voltage ratio of an output voltage of the first power circuit 31, that is, the first reference voltage Vref1, to an output voltage of the second power circuit 32, that is, the second reference voltage Vref2. For example, when the first reference voltage Vref1 is set to 91% of the supply voltage VDD (VDD×0.91) and the second reference voltage Vref2 is set to 90% of the supply voltage VDD (VDD×0.90), the capacitance ratio of the capacitance value Cref to the capacitance value Ccoup is set to 90:1.

Figure 12:
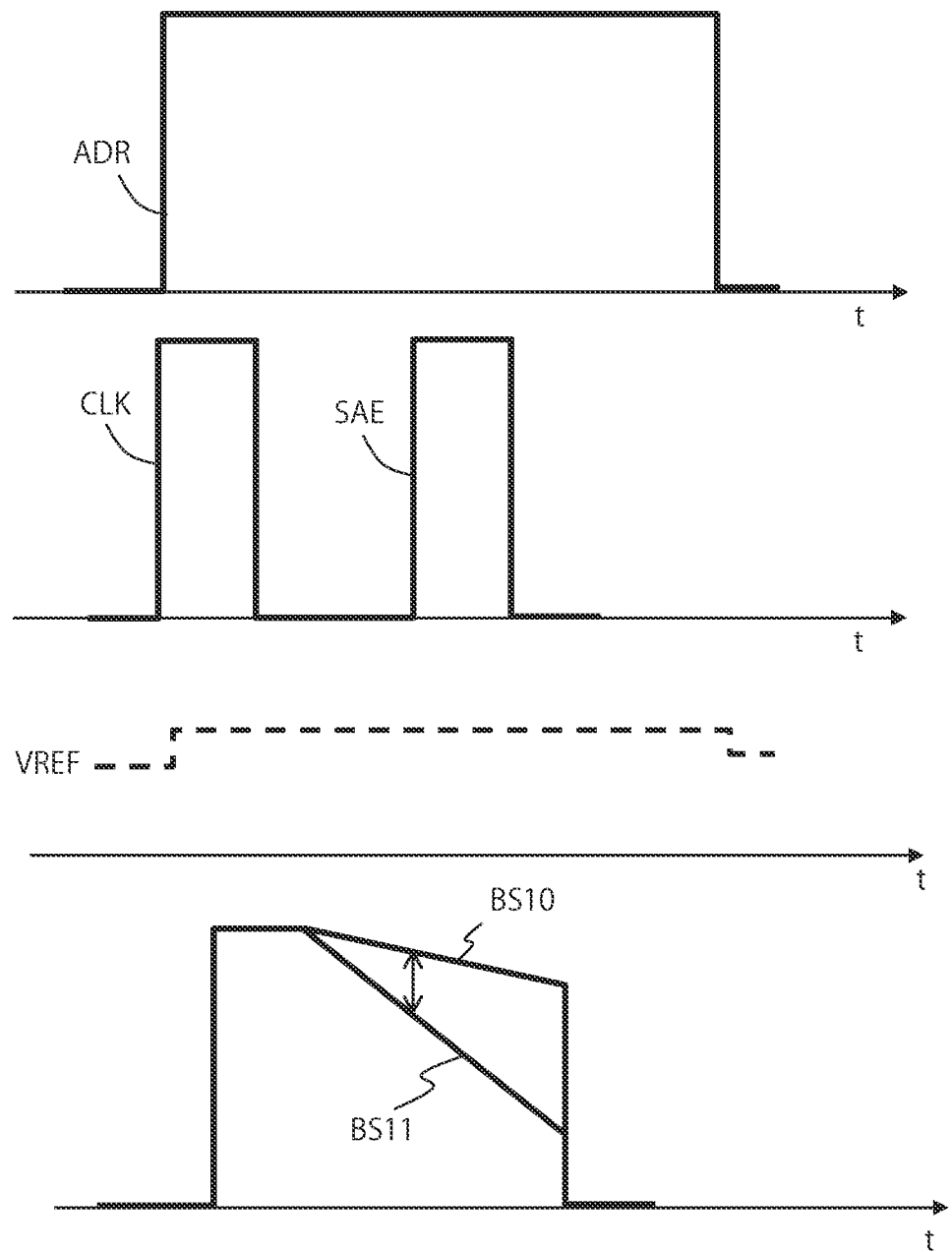
FIG. 12 is a timing chart of a selecting operation performed by the second selection circuit according to the first modification.

FIG. 12 is a timing chart of a selecting operation performed by the second selection circuit 33a according to the first modification. Here, an operation performed when the address signal ADR changes from a low level to a high level is described.

When the address signal ADR inputted to the inverter 301 changes from a low level to a high level, first, the potential at one end of the second capacitive element 322 connected to the inverter 302 at the middle stage becomes a high level. Therefore, the voltage VREF of the second input terminal 202 of the sense amplifier 20 increases from the second reference voltage Vref2 by the capacitance ratio of the first capacitive element 321 to the second capacitive element 322 due to coupling effect of the first capacitive element 321 and the second capacitive element 322. That is, the voltage VREF rises from the second reference voltage Vref2 to the first reference voltage Vref1.

Next, the second switching element 312 is turned on and the third switching element 313 is turned off by the address signal ADR at a low level inputted from the output terminal of the inverter 303.

Next, the first switching element 311 is turned on and the fourth switching element 314 is turned off by the address signal ADR at a high level inputted from the output terminal of the inverter 304. As a result, the power circuit connected to the second input terminal 202 of the sense amplifier 20 is switched from the second power circuit 32 to the first power circuit 31.

Next, the sense amplifier 20 compares a signal voltage inputted from one of the first memory circuits 11 to a first input terminal 201 through the global bit line GBL with the first reference voltage Vref1 inputted to the second input terminal 202, based on the timing of the delayed signal SAE. The sense amplifier 20 reads out the first bit signal BS10 or the first bit signal BS11 according to the comparison result.

According to the present modification described above, the switching speed of a reference voltage is accelerated by the coupling effect of the first capacitive element 321 and the second capacitive element 322. Therefore, it is possible to further accelerate the readout operation of bit signals.

(Second Modification)

Figure 13:
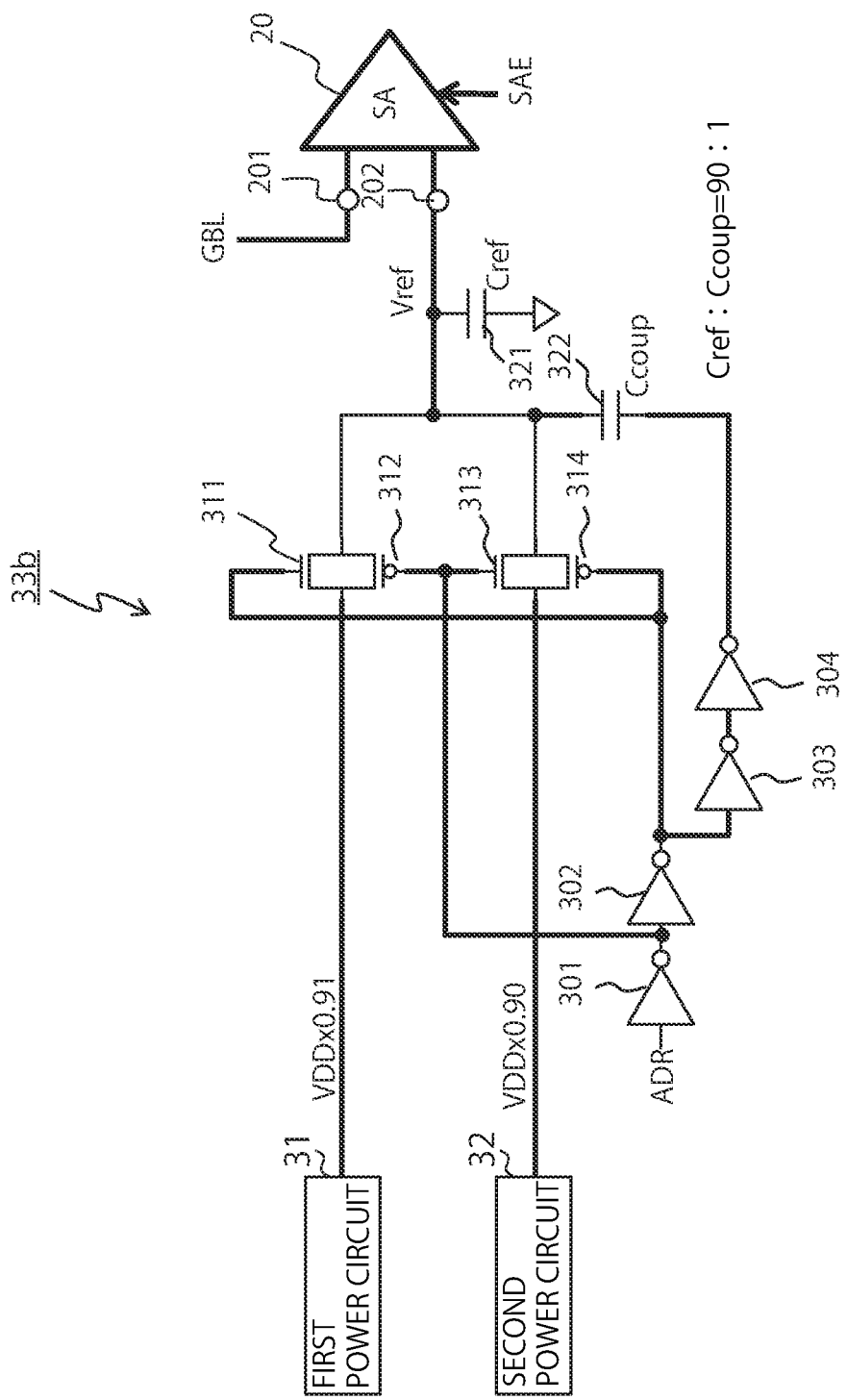
FIG. 13 is a block diagram illustrating a configuration of a second selection circuit according a second modification.

FIG. 13 is a block diagram illustrating a configuration of a second selection circuit according a second modification. In this modification, circuit elements identical to those of the second selection circuit 33a according to the first modification are denoted with like reference signs and detailed explanations thereof are omitted.

A second selection circuit 33b illustrated in FIG. 13 is different from the second selection circuit 33a in that the gates of the second and third switching elements 312 and 313 are connected to an output terminal of the inverter 301 at a frontmost stage.

The second selection circuit 33b is also different from the second selection circuit 33a in that the gates of the first and fourth switching elements 311 and 314 are connected to an output terminal of the inverter 302 at a middle stage.

In the second selection circuit 33b configured as described above, when the address signal ADR inputted to the inverter 301 changes from a low level to a high level, first, the second switching element 312 is turned on and the third switching element 313 is turned off by the address signal ADR at a low level inputted from an output terminal of the inverter 301.

Next, the first switching element 311 is turned on and the fourth switching element 314 is turned off by the address signal ADR at a high level inputted from an output terminal of the inverter 302. As a result, the power circuit connected to the second input terminal 202 of the sense amplifier 20 is switched from the second power circuit 32 to the first power circuit 31.

Next, the potential at one end of the second capacitive element 322 connected to an output terminal of the inverter 304 becomes a high level. Therefore, similarly to the first modification, the voltage VREF of the second input terminal of the sense amplifier 20 increases from the second reference voltage Vref2 by the capacitance ratio of the first capacitive element 321 to the second capacitive element 322 due to the coupling effect of the first capacitive element 321 and the second capacitive element 322. That is, the voltage VREF rises from the second reference voltage Vref2 to the first reference voltage Vref1.

Next, the sense amplifier 20 compares a signal voltage inputted from the first memory circuit 11 to the first input terminal 201 through the global bit line GBL with the first reference voltage Vref1 inputted to the second input terminal 202 based on the timing of the delayed signal SAE. The sense amplifier 20 reads out a first bit signal BS10 or a first bit signal BS11 according to the comparison result.

According to the present modification described above, the second selection circuit 33b switches the reference voltage after selecting the power circuit. At this time, similarly to the first modification, the switching speed of a reference voltage is accelerated by the coupling effect of the first capacitive element 321 and the second capacitive element 322. Therefore, it is possible to further accelerate the readout operation of bit signals.

(Third Modification)

Figure 14:
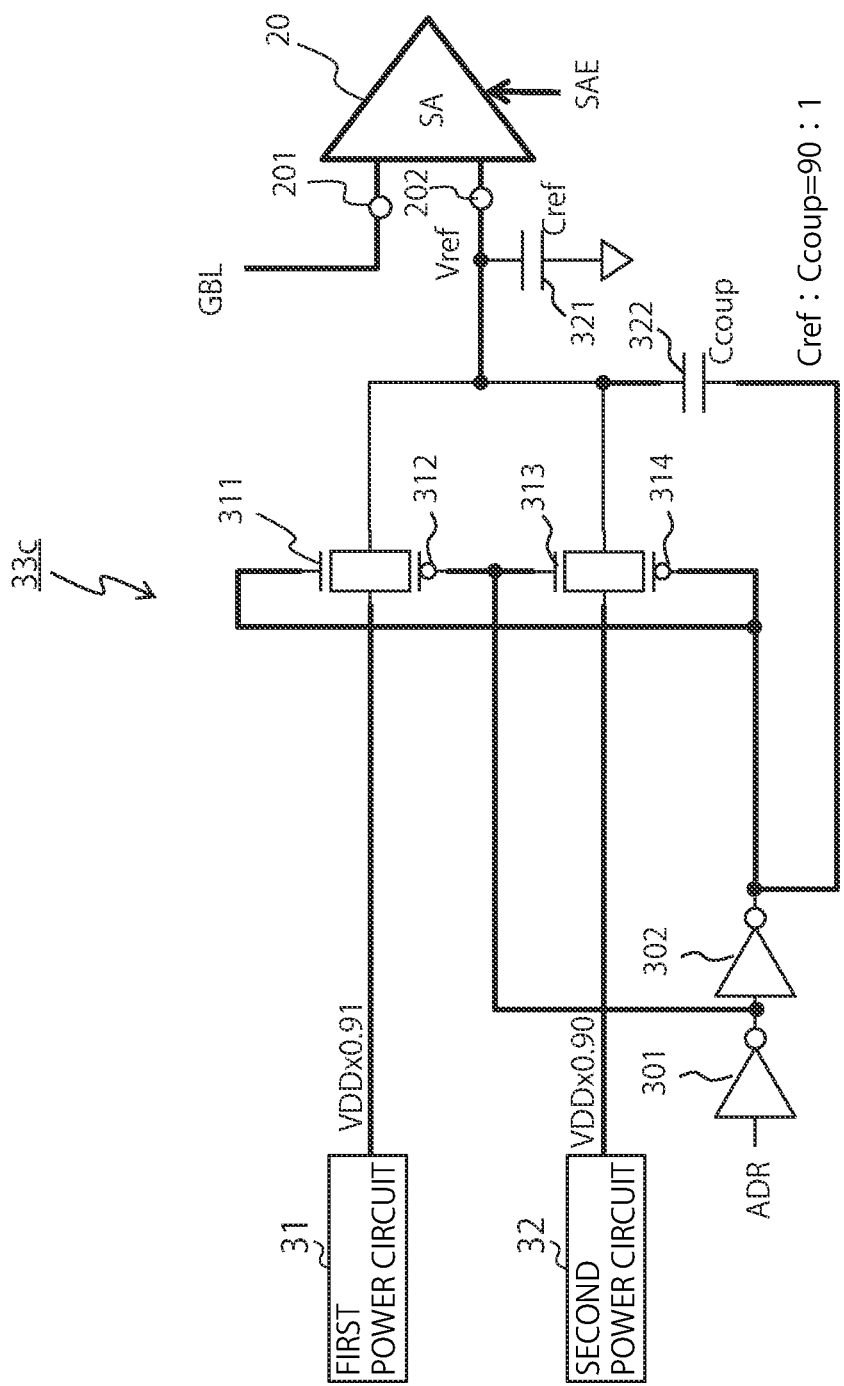
FIG. 14 is a block diagram illustrating a configuration of a second selection circuit according a third modification.

FIG. 14 is a block diagram illustrating a configuration of a second selection circuit according a third modification. In this modification, circuit elements identical to those of the second selection circuit 33b according to the second modification are denoted with like reference signs and detailed explanations thereof are omitted.

In a second selection circuit 33c illustrated in FIG. 14, the number of inverters is half of that of the second selection circuit 33b according to the second modification. That is, the second selection circuit 33c according to the present modification includes the inverter 301 and the inverter 302, but does not include the inverter 303 and the inverter 304. Therefore, an output terminal of the inverter 302 at a rearmost stage is connected to the gate of the first switching element 311, the gate of the fourth switching element 314, and one end of the second capacitive element 322.

In the second selection circuit 33c configured as described above, when the address signal ADR inputted to the inverter 301 changes from a low level to a high level, first, the second switching element 312 is turned on and the third switching element 313 is turned off by the address signal ADR at a low level inputted from an output terminal of the inverter 301.

Next, the first switching element 311 is turned on and the fourth switching element 314 is turned off by the address signal ADR at a high level inputted from an output terminal of the inverter 302. As a result, the power circuit connected to the second input terminal 202 of the sense amplifier 20 is switched from the second power circuit 32 to the first power circuit 31.

Simultaneously with the switching of the power circuit, the potential at one end of the second capacitive element 322 connected to the output terminal of the inverter 302 becomes a high level. Therefore, similarly to the second modification, the voltage VREF of the second input terminal of the sense amplifier 20 increases from the second reference voltage Vref2 by the capacitance ratio of the first capacitive element 321 to the second capacitive element 322 due to the coupling effect of the first capacitive element 321 and the second capacitive element 322. That is, the voltage VREF rises from the second reference voltage Vref2 to the first reference voltage Vref1.

Next, based on the timing of the delayed signal SAE, the sense amplifier 20 compares a signal voltage inputted from one of the first memory circuits 11 to the first input terminal 201 through the global bit line GBL with the first reference voltage Vref1 inputted to the second input terminal 202. The sense amplifier 20 reads out a first bit signal BS10 or BS11 according to the comparison result.

According to the present modification described above, similarly to the second modification, the switching speed of a reference voltage is accelerated by the coupling effect of the first capacitive element 321 and the second capacitive element 322. Therefore, it is possible to accelerate the readout operation of bit signals. Further, in the present modification, the second selection circuit 33c simultaneously performs selection of the power circuit and switching of the reference voltage. Therefore, it is possible to further accelerate the readout operation of bit signals.

(Fourth Modification)

Figure 15:
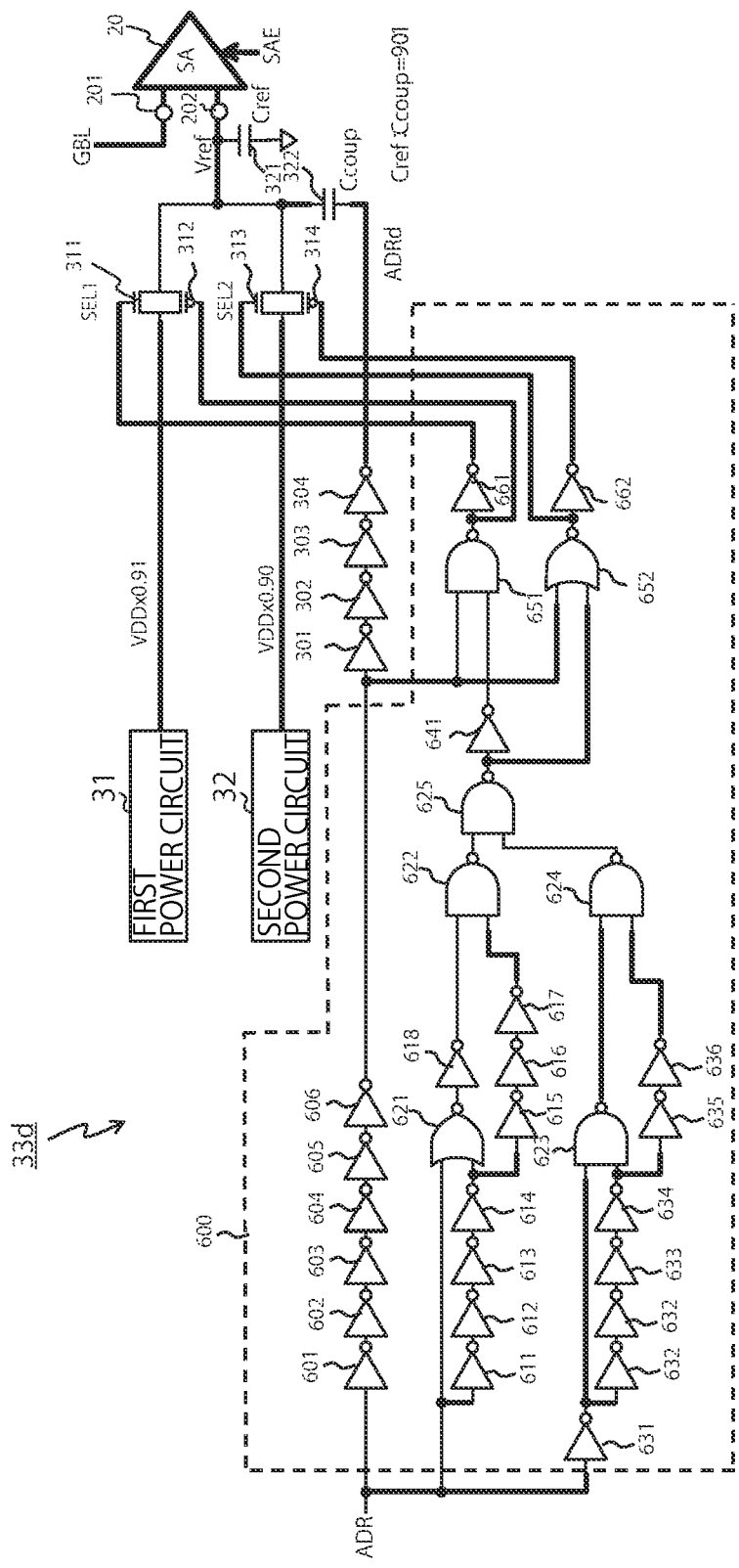
FIG. 15 is a block diagram illustrating a configuration of a second selection circuit according a fourth modification.

FIG. 15 is a block diagram illustrating a configuration of a second selection circuit according a fourth modification. In the first to third modifications described above, the first to fourth switching elements 311 to 314 are driven by the inverters 301 to 304.

Meanwhile, in a second selection circuit 33d according to the present modification, each switching element is driven by a drive circuit 600 as illustrated in FIG. 15. The drive circuit 600 is a circuit that controls all of the switching elements 311 to 314 so that these switching elements enter an unselected state in which neither the first power circuit 31 nor the second power circuit 32 is selected when the level of the address signal ADR as an input signal changes from a low level ("0") to a high level ("1") or from a high level to a low level. Further, the drive circuit 600 is a circuit that executes control so that a delayed address signal ADRd changes from a low level ("0") to a high level ("1") while all of the switching elements 311 to 314 are not selected and, after the delayed address signal ADRd has changed, one of the switching elements 311 to 314 enters a selected state in which the first power circuit 31 or the second power circuit 32 is selected. Here, the delayed address signal ADRd is a delayed signal obtained by delaying the address signal ADR. A configuration of the drive circuit 600 is described below.

The drive circuit 600 is provided with inverters 601 to 606 connected with one another in series. The address signal ADR is inputted to the inverter 601 at a frontmost stage. The inverter 606 at a rearmost stage is connected to the inverter 301.

The drive circuit 600 is further provided with inverters 611 to 617 connected with one another in series. The address signal ADR is inputted to the inverter 611 at a frontmost stage. An output terminal of the inverter 614 at a middle stage is connected to an input terminal of a NAND circuit 622.

The NAND circuit 622 outputs a result of a NOR operation between the address signal ADR and an output signal from the inverter 614. An output signal indicating an operation result is inverted by the inverter 618 and then inputted to the NAND circuit 622.

The NAND circuit 622 outputs a result of a NAND operation between an output signal from the inverter 618 and an output signal from the inverter 617. An output signal indicating an operation result is inputted to a NAND circuit 625.

The drive circuit 600 is further provided with inverters 631 to 636 connected with one another in series. The address signal ADR is inputted to the inverter 631 at a frontmost stage. The address signal ADR is inverted by the inverter 631 and then inputted to a NAND circuit 623. An output signal from the inverter 634 at a middle stage is also inputted to the NAND circuit 623.

The NAND circuit 623 outputs a result of a NAND operation between an output signal from the inverter 631 and an output signal from the inverter 634. An output signal indicating an operation result is inputted to a NAND circuit 624. An output signal from the inverter 636 is also inputted to the NAND circuit 624.

The NAND circuit 624 outputs a result of a NAND operation between an output signal from the NAND circuit 623 and an output signal from the inverter 636. An output signal indicating an operation result is inputted to a NAND circuit 625.

The NAND circuit 625 outputs a result of a NAND operation between an output signal from the NAND circuit 622 and an output signal from the NAND circuit 624. An output signal indicating the operation result is inputted to a NOR circuit 652. An output signal from the NAND circuit 625 is inverted by the inverter 641 and then inputted to a NAND circuit 651.

The NAND circuit 651 outputs a result of a NAND operation between an output signal from the inverter 606 and an output signal from the inverter 641. An output signal indicating an operation result is inputted to the gate of the second switching element 312. An output signal from the NAND circuit 651 is inverted by the inverter 661. This inverted signal is inputted to the gate of the first switching element 311 as a selection signal SEL1.

The NOR circuit 652 outputs a result of a NOR operation between an output signal from the inverter 606 and an output signal from the NAND circuit 625. An output signal indicating an operation result is inputted to the gate of the third switching element 313 as a selection signal SEL2. An output signal from the NOR circuit 652 is inverted by the inverter 662. This inverted signal is inputted to the gate of the fourth switching element 314.

Figure 16:
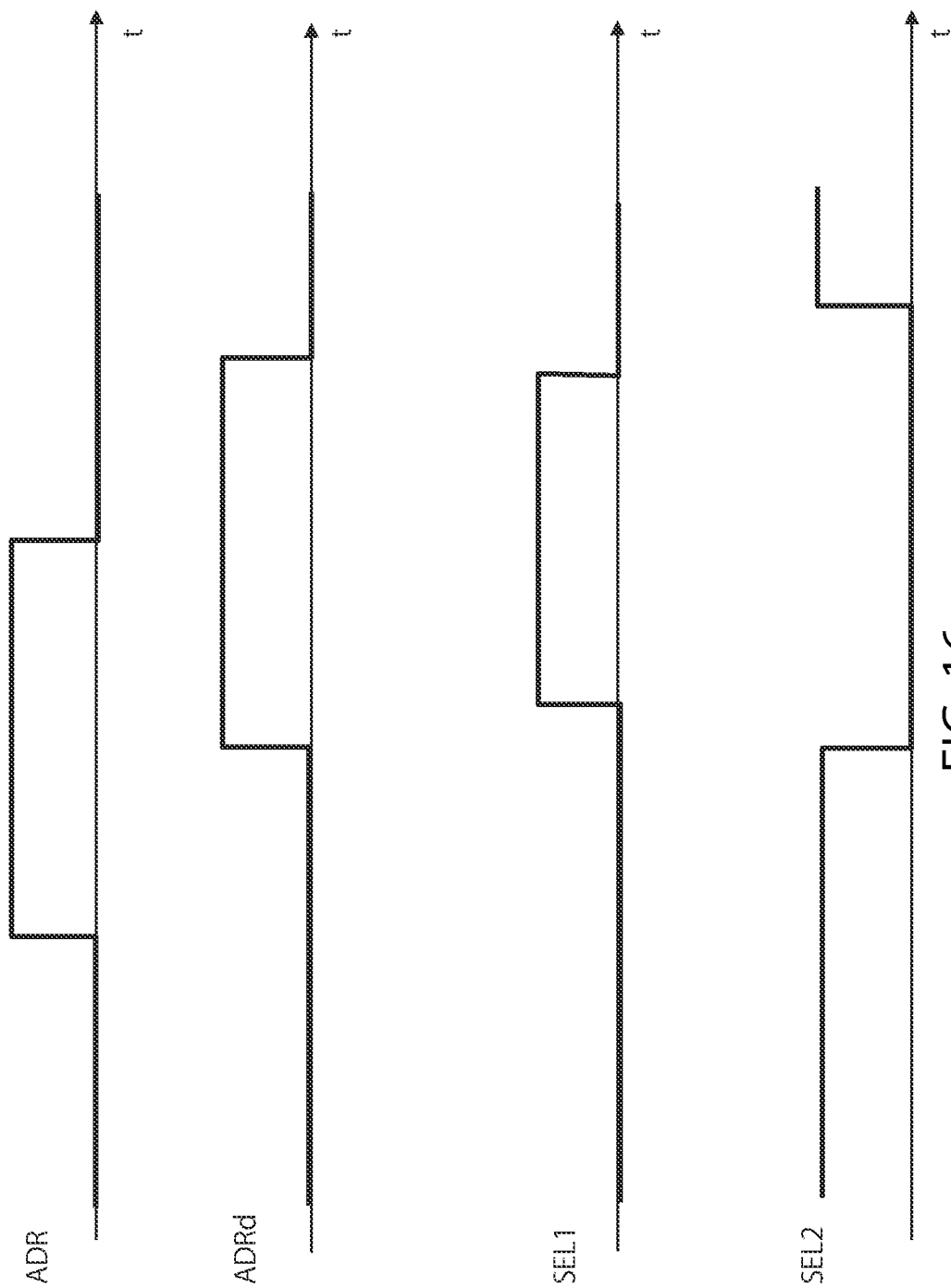
FIG. 16 is a timing chart of a selecting operation performed by the second selection circuit according to the fourth modification.

FIG. 16 is a timing chart of a selecting operation performed by the second selection circuit 33d according to the fourth modification. Here, an operation performed when the address signal ADR changes from a low level to a high level is described.

At a timing when the address signal ADR inputted to the inverter 301 changes from a low level to a high level, the selection signal SEL1 is at a low level and the selection signal SEL2 is at a high level. With this state, the first switching element 311 and the second switching element 312 are in an off-state and the third switching element 313 and the fourth switching element 314 are in an on-state.

Next, when the delayed address signal ADRd obtained by delaying the address signal ADR changes from a low level to a high level by the inverters 601 to 606 and the inverters 301 to 304, the potential at one end of the second capacitive element 322 becomes a high level. Therefore, the voltage VREF of the second input terminal 202 of the sense amplifier 20 increases from the second reference voltage Vref2 by the capacitance ratio of the first capacitive element 321 to the second capacitive element 322 due to the coupling effect of the first capacitive element 321 and the second capacitive element 322. That is, the voltage VREF rises from the second reference voltage Vref2 to the first reference voltage Vref1.

At a timing when the delayed address signal ADRd changes from a low level to a high level, the selection signal SEL1 maintains to be a low level while the selection signal SEL2 changes from a high level to a low level through a NOR operation and a NAND operation in the drive circuit 600. This maintains the off-state of the first switching element 311 and the second switching element 312 and causes the third switching element 313 and the fourth switching element 314 to also enter an off-state. Therefore, the power circuit connected to the second input terminal 202 of the sense amplifier 20 enters an unselected state.

When a predetermined time passes after the selection signal SEL2 changes from a high level to a low level, the selection signal SEL1 changes from a low level to a high level. At this time, the delayed address signal ADRd and the selection signal SEL2 maintain to be a high level. This causes the first switching element 311 and the second switching element 312 to enter an on-state. As a result, the first power circuit 31 is connected to the second input terminal 202 of the sense amplifier 20.

Subsequently, similarly to the other modifications described above, the sense amplifier 20 compares a signal voltage inputted from one of the first memory circuits 11 to the first input terminal 201 through the global bit line GBL with the first reference voltage Vref1 inputted to the second input terminal 202 based on the timing of the delayed signal SAE. The sense amplifier 20 reads out the first bit signal BS10 or the first bit signal BS11 according to the comparison result.

According to the present modification described above, similarly to the other modifications, the switching speed of a reference voltage is accelerated by the coupling effect of the first capacitive element 321 and the second capacitive element 322. Therefore, it is possible to further accelerate the readout operation of bit signals. In the present modification, the drive circuit 600 of the first to fourth switching elements 311 to 314 is provided independently of the second capacitive element 322. Therefore, the controllability of the operations of each switching element is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a first memory circuit;
a second memory circuit having a storage capacity smaller than that of the first memory circuit;
a readout line commonly connected to the first memory circuit and the second memory circuit;
a sense amplifier configured to compare a voltage of a first bit signal or a second bit signal with a reference voltage, where the first bit signal being inputted from the first memory circuit through the readout line and the second bit signal being inputted from the second memory circuit through the readout line; and
a readout conditioning circuit configured to change at least one of an operation timing of the sense amplifier and the reference voltage corresponding to the first bit signal and the second bit signal, wherein
the readout conditioning circuit comprises:
a first power circuit configured to output a first reference voltage;
a second power circuit configured to output a second reference voltage lower than the first reference voltage; and
a second selection circuit configured to select the first power circuit when the first bit signal is inputted to the sense amplifier and to select the second power circuit when the second bit signal is inputted to the sense amplifier,
the second selection circuit comprises:
a plurality of inverters connected with one another in series;
a switching element configured to switch a connection destination of the sense amplifier to the first power circuit or the second power circuit;
a first capacitive element having one end thereof connected to an input terminal of the sense amplifier and the other end thereof grounded; and
a second capacitive element having one end thereof connected to an inverter at a middle stage among the plurality of inverters and the other end thereof connected to the input terminal,
the switching element is connected to an inverter at a rear stage with respect to the inverter at the middle stage among the plurality of inverters, and
a capacitance value of the second capacitive element is smaller than a capacitance value of the first capacitive element.

2. The device of claim 1, wherein each of the first memory circuit and the second memory circuit comprises a plurality of memory cells.

3. The device of claim 2, wherein number of memory cells of the second memory circuit is smaller than number of memory cells of the first memory circuit.

4. A semiconductor storage device comprising:
a first memory circuit;
a second memory circuit having a storage capacity smaller than that of the first memory circuit;
a readout line commonly connected to the first memory circuit and the second memory circuit;
a sense amplifier configured to compare a voltage of a first bit signal or a second bit signal with a reference voltage, where the first bit signal being inputted from the first memory circuit through the readout line and the second bit signal being inputted from the second memory circuit through the readout line; and a readout conditioning circuit configured to change at least one of an operation timing of the sense amplifier and the reference voltage corresponding to the first bit signal and the second bit signal, wherein the readout conditioning circuit comprises:

a first power circuit configured to output a first reference voltage;

a second power circuit configured to output a second reference voltage lower than the first reference voltage; and a second selection circuit configured to select the first power circuit when the first bit signal is inputted to the sense amplifier and to select the second power circuit when the second bit signal is inputted to the sense amplifier, the second selection circuit comprises:

a plurality of inverters connected with one another in series;

a switching element configured to switch a connection destination of the sense amplifier to the first power circuit or the second power circuit;

a first capacitive element having one end thereof connected to an input terminal of the sense amplifier and the other end thereof grounded; and a second capacitive element having one end thereof connected to an output terminal of an inverter at a rearmost stage among the plurality of inverters and the other end thereof connected to the input terminal, the switching element is connected to an output terminal of an inverter at a front stage with respect to the inverter at the rearmost stage among the plurality of the inverters, and a capacitance value of the second capacitive element is smaller than a capacitance value of the first capacitive element.

5. A semiconductor storage device comprising:

a first memory circuit;

a second memory circuit having a storage capacity smaller than that of the first memory circuit;

a readout line commonly connected to the first memory circuit and the second memory circuit;

a sense amplifier configured to compare a voltage of a first bit signal or a second bit signal with a reference voltage, where the first bit signal being inputted from the first memory circuit through the readout line and the second bit signal being inputted from the second memory circuit through the readout line; and a readout conditioning circuit configured to change at least one of an operation timing of the sense amplifier and the reference voltage corresponding to the first bit signal and the second bit signal, wherein the readout conditioning circuit comprises:

a first power circuit configured to output a first reference voltage;

a second power circuit configured to output a second reference voltage lower than the first reference voltage; and a second selection circuit configured to select the first power circuit when the first bit signal is inputted to the sense amplifier and to select the second power circuit when the second bit signal is inputted to the sense amplifier, the second selection circuit comprises:

a plurality of inverters connected with one another in series;

a switching element configured to switch a connection destination of the sense amplifier to the first power circuit or the second power circuit;

a first capacitive element having one end thereof connected to an input terminal of the sense amplifier and the other end thereof grounded; and a second capacitive element having one end thereof connected to an output terminal of an inverter at a rearmost stage among the plurality of inverters and the other end thereof connected to the input terminal, the switching element is connected to the output terminal of the inverter at the rearmost stage, and a capacitance value of the second capacitive element is smaller than a capacitance value of the first capacitive element.

6. A semiconductor storage device comprising:

a first memory circuit;

a second memory circuit having a storage capacity smaller than that of the first memory circuit;

a readout line commonly connected to the first memory circuit and the second memory circuit;

a sense amplifier configured to compare a voltage of a first bit signal or a second bit signal with a reference voltage, where the first bit signal being inputted from the first memory circuit through the readout line and the second bit signal being inputted from the second memory circuit through the readout line; and a readout conditioning circuit configured to change at least one of an operation timing of the sense amplifier and the reference voltage corresponding to the first bit signal and the second bit signal, wherein the readout conditioning circuit comprises:

a first power circuit configured to output a first reference voltage;

a second power circuit configured to output a second reference voltage lower than the first reference voltage; and a second selection circuit configured to select the first power circuit when the first bit signal is inputted to the sense amplifier and to select the second power circuit when the second bit signal is inputted to the sense amplifier, the second selection circuit comprises:

a plurality of inverters connected with one another in series;

a switching element configured to switch a connection destination of the sense amplifier to the first power circuit or the second power circuit;

a first capacitive element having one end thereof connected to an input terminal of the sense amplifier and the other end thereof grounded;

a second capacitive element having one end thereof connected to an output terminal of an inverter at a rearmost stage among the plurality of inverters and the other end thereof connected to the input terminal; and a drive circuit configured to drive the switching element, the drive circuit controls the switching element to enter an unselected state in which neither the first power circuit nor the second power circuit is selected when an input signal changes from a low level to a high level or from a high level to a low level, and the drive circuit executes control to cause a delayed signal being a signal obtained by delaying the input signal to change from a low level to a high level or from a high level to a low level while the switching element is not selected and, after the delayed signal has changed, the switching element enters a selected state in which the first power circuit or the second power circuit is selected, and a capacitance value of the second capacitive element is smaller than a capacitance value of the first capacitive element.

* * * * *